United States Patent [19]

Nagano

[11] 4,268,789
[45] May 19, 1981

[54] LIMITER CIRCUIT

[75] Inventor: Katsumi Nagano, Yokohama, Japan

[73] Assignee: Tokyo Shibaura Denki Kabushiki Kaisha, Japan

[21] Appl. No.: 24,973

[22] Filed: Mar. 29, 1979

[30] Foreign Application Priority Data

Apr. 5, 1978 [JP] Japan ................... 53-39956

[51] Int. Cl.³ .............................................. H03K 5/08
[52] U.S. Cl. .................................... 323/315; 307/564
[58] Field of Search ................... 323/1, 4, 9; 307/237, 307/264; 328/169, 171

[56] References Cited

U.S. PATENT DOCUMENTS 3,569,740 3/1971 Avins .................... 307/237
3,916,293 10/1975 Omori et al. ............ 323/9
3,932,768 1/1976 Takahashi et al. ........ 307/237
3,974,400 8/1976 Takeda et al. ........... 307/237

OTHER PUBLICATIONS

Wong and Ott, "Function Circuits, Design and Applications", pp. 86–91.
Tobey, Graeme and Huelsman, "Operational Amplifier, Design and Applications", pp. 236–259.

Primary Examiner—William M. Shoop
Assistant Examiner—Peter S. Wong
Attorney, Agent, or Firm—Finnegan, Henderson, Farabow, Garrett & Dunner

[57] ABSTRACT

A limiter circuit comprising a current mirror circuit to which is supplied input voltage; an impedance element to one end of which is connected an output terminal of said current mirror circuit; a first transistor connected to the other end of said impedance element; a second transistor connected between said first transistor and the ground potential point and to the base of which is supplied reference voltage; and a bias means for providing the base of said first transistor with base bias.

10 Claims, 15 Drawing Figures

LIMITER CIRCUIT

BACKGROUND OF THE INVENTION

The present invention relates to a limiter circuit capable of blocking output current from flowing until input supply voltage reaches a predetermined value.

FIGS. 1 and 2 show examples of conventional limiter circuit each comprising a diode. The limiter circuit shown in FIG. 1 comprises a resistor 1 to one end of which is supplied positive input voltage +Vi, a resistor 2 to one end of which is supplied negative reference voltage −e, and a diode 3 whose anode is connected to the other ends of resistors 1 and 2, respectively, and whose cathode is connected to the ground potential point. On the other hand, the limiter circuit shown in FIG. 2 comprises a resistor 1 to one end of which is supplied negative input voltage −Vi, a resistor 2 to one end of which is supplied positive reference voltage +e, and a diode 3 whose cathode is connected to the other ends of resistors 1 and 2, respectively, and whose anode is connected to the ground potential point. FIGS. 3 and 4 show characteristic curves of the relation between input voltage Vi and output current I of the limiter circuits shown in FIGS. 1 and 2, respectively. Input voltage is plotted on the abscissa and output current I on the ordinate. As is apparent from FIGS. 3 and 4, output current I does not flow when input voltage Vi (absolute value) is small, but starts to flow only when input voltage Vi reaches $e \cdot R_1/R_2$ (in the case of circuit shown in FIG. 1) and $-e \cdot R_1/R_2$ (in the case of circuit shown in FIG. 2). Thereafter, as input voltage Vi (absolute value) increases, output current I also increases at the slope of $1/R_1$. $R_1$ and $R_2$ represent the resistance values of resistors 1 and 2, respectively.

As described above, the circuits shown in FIGS. 1 and 2 serve to block current from flowing until input voltage Vi comes to predetermined values ($e \cdot R_1/R_2$) in the case of circuit shown in FIG. 1 and ($-e \cdot R_1/R_2$) in the case of circuit shown in FIG. 2. In short, these circuits serve to function as a limiter circuit.

However, the conventional limiter circuits shown in FIGS. 1 and 2 have disadvantages in that a reference voltage having a polarity reverse to that of the input voltage is needed and in that a current buffer circuit must be arranged between the diode and the ground potential point to take out output current since the diode is connected to the ground potential point.

SUMMARY OF THE INVENTION

The present invention is intended to eliminate the above-mentioned drawbacks and to provide a limiter circuit making it unnecessary to use a reference voltage having a polarity reverse to that of the input voltage and capable of directly taking out output current without a current buffer circuit or the like.

According to the present invention, there is provided a limiter circuit comprising a current mirror circuit having an input terminal to which an input voltage is supplied and having first and second output terminals; an impedance element whose one end is connected to the first output terminal of the current mirror circuit; a first transistor of first conductivity type to one end of whose collector-emitter path is connected to the other end of the impedance element; a second transistor of second conductivity type whose collector-emitter path is connected between the other end of the collector-emitter path of first transistor and the ground potential point and to the base of which is supplied a reference potential signal; and a bias means providing the base of the first transistor with base bias.

DETAILED DESCRIPTION OF THE PREFERRED EMBODIMENT

Figure 1:
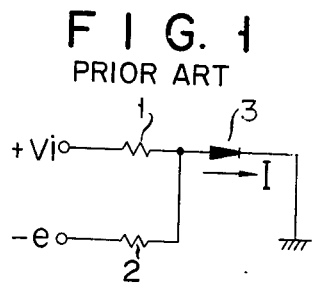
FIGS. 1 and 2 are circuit diagrams showing conventional limiter circuits, respectively.
Figure 2:
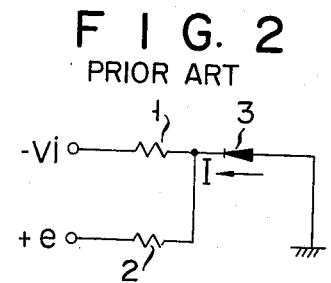
Figure 3:
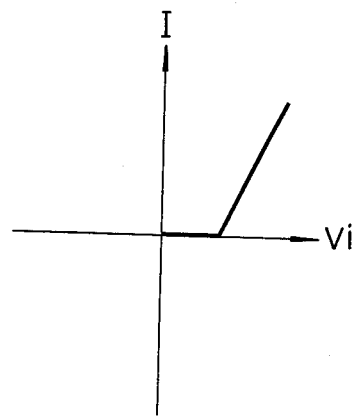
FIGS. 3 and 4 show characteristic curves of the relation between input voltages and output current of each of the limiter circuits shown in FIGS. 1 and 2.
Figure 4:
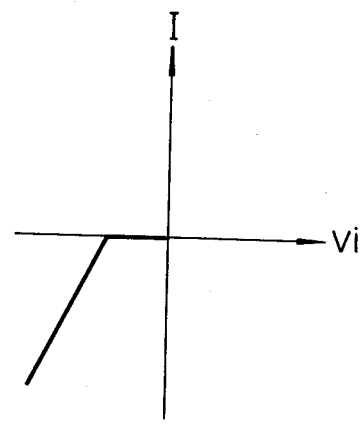
Figure 5:
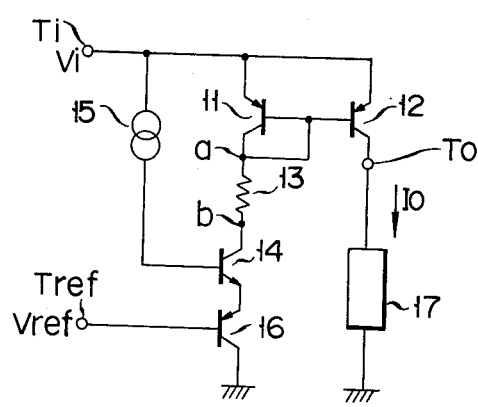
FIG. 5 is a circuit diagram showing an embodiment of a limiter circuit according to the present invention.

FIG. 5 shows an embodiment of a limiter circuit according to the present invention. The emitters of two transistors 11 and 12 of PNP type are commonly connected to each other and also to a terminal Ti to which is supplied positive input voltage Vi. The bases of transistors 11 and 12 are commonly connected to each other and the base of transistor 11 is connected to the collector thereof, too. Namely, transistors 11 and 12 form a current mirror circuit. To the collector of transistor 11 is connected one end of a resistor 13 for controlling current. To the other end of resistor 13 is connected the collector of a transistor 14 of NPN type. "Impedance element" in the claims attached hereto is intended to express resistor 13 in broad conception. Between the base of transistor 14 and terminal Ti to which input voltage Vi is supplied is connected a constant-current source 15 for base bias. A high resistance, for example, can be used as this constant-current source. To the emitter of transistor 14 is connected the emitter of a transistor 16 of PNP type. The base of transistor 16 is connected to a reference signal input terminal Tref to which reference voltage Vref is supplied. The collector of transistor 16 is connected to the ground potential point. The collector of transistor 12 is connected to an output terminal To of the limiter circuit. A load circuit 17 is connected between the output terminal To and the ground potential point.

Figure 6:
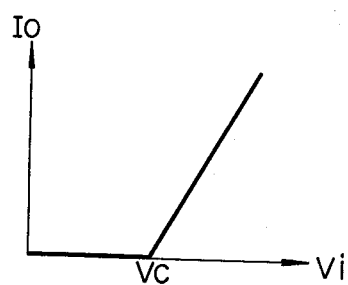
FIG. 6 shows a characteristic curve of the relation between input voltage and output current of the limiter circuit shown in FIG. 5.

The operation of the limiter circuit will be now described with reference to a characteristic curve in FIG. 6 which shows the relation between input voltage Vi and output current Io.

It is now assumed that positive input voltage Vi is supplied to the input terminal Ti and that positive reference voltage Vref having the same polarity as that of input voltage Vi is supplied to the reference signal input terminal Tref. In addition, it is also assumed that the base bias current is of such a degree that the transistor 14 is brought into a substantial saturation state by means of constant-current source 15 connected to the base of transistor 14.

When the value of input voltage Vi is small, the transistor 16 is not turned "ON" so that current does not flow through the resistor 13. Then, collector current does not flow through the transistor 12 and output current Io flowing through the load circuit 17 is zero as shown in FIG. 6. When input voltage Vi increases and the potential at a point "b" at one side of resistor 13, that is at the junction between resistor 13 and the collector of transistor 14, exceeds the sum of reference voltage Vref voltage drop between the base and emitter of transistor 16, current starts to flow through the resistor 13. Assuming that voltage between the base and emitter of transistor 11 is $V_{BE}(11)$, potential Va at a point "a", that is at the junction between resistor 13 and the collector and base of transistor 11, can be calculated from the following equation:

$$Va = Vi - V_{BE}(11) \qquad (1)$$

Further, assuming the saturation voltage between the collector and emitter of transistor 14 is $V_{CEsat}(14)$ and that the voltage between the base and emitter of transistor 16 is $V_{BE}(16)$, potential Vb at the point b can be calculated from the following equation:

$$Vb = V_{CEsat}(14) + V_{BE}(16) + Vref \qquad (2)$$

Therefore, output current Io flowing into the load circuit 17 can be calculated from the following equation:

$$Io = \frac{Va - Vb}{R_{13}} \qquad (3)$$

In the above equation, $R_{13}$ represents the resistance value of resistor 13. When equations (1) and (2) are substituted in equation (3), the following equation can be obtained:

$$Io = \frac{\{Vi - V_{BE}(11)\} - \{V_{CEsat}(14) + V_{BE}(16) + Vref\}}{R_{13}} \qquad (4)$$

Assuming that $V_{BE}(11) \sim V_{BE}(16) = V_{BE}$, since $V_{BE}(11)$ and $V_{BE}(16)$ have almost the equivalent value of each other, and that $V_{CEsat}(14)$ is a value small enough to be negligible, equation (4) can be modified to the following equation:

$$Io = \frac{Vi - (Vref + 2V_{BE})}{R_{13}} \qquad (5)$$

When $(Vref + 2V_{BE})$ is expressed as Vc, equation (5) can be modified to the following equation (6):

$$Io = \frac{Vi - Vc}{R_{13}} \qquad (6)$$

In the above equation, Vc represents the base potential of transistor 14. When the value of input voltage Vi rises to Vc, output current Io starts to flow and thereafter increases at the slope of $1/R_{13}$ as shown in FIG. 6 according to the increase of input voltage Vi. Namely, it can be understood that the circuit shown in FIG. 5 serves to function as a limiter circuit whose cut-off voltage is the base voltage Vc of transistor 14. The value of cut-off voltage Vc can be freely changed by optionally selecting the value of reference Vref.

In the case of the limiter circuit shown in FIG. 5, the polarity of reference voltage Vref is same as that of input voltage Vi to thereby make it unnecessary to supply a reference voltage having a polarity reverse to that of the input voltage as is required by conventional circuits. In addition, it is also unnecessary to add a current buffer circuit, like conventional limiter circuits, for the purpose of taking out current since output current Io can be obtained as output current of the current mirror circuit.

Figure 7:
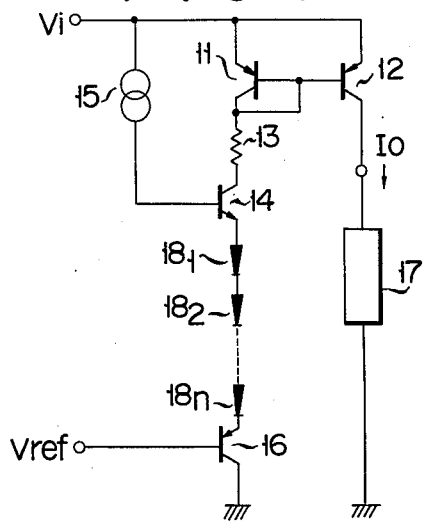
FIG. 7 shows another embodiment of limiter circuit according to the present invention.

FIG. 7 shows another embodiment of a limiter circuit according to the present invention wherein n units of diodes $18_1$—$18_n$ are connected in series between transistors 14 and 16 in such a way that cathodes of these diodes are directed to the side of transistor 16. Same reference numerals are attached to the same components of this embodiment as those of the one shown in FIG. 5 and description is omitted about these components for clarity. The same thing can be said about the embodiments shown in FIGS. 8 and 9 which will be described later. The embodiment shown in FIG. 7 is provided with n units of diodes. Therefore, assuming that the cut-off voltage is Vc', Vc' can be expressed by the following equation:

$$Vc' = Vref + (n+2)V_{BE} \qquad (7)$$

Usually, the forward voltage drop of a diode is about 0.7 volts and cut-off voltage Vc can be increased about 0.7 volts for each diode inserted. Since cut-off voltage is expressed as equation (7), output current Io in this case can be obtained from the following equation:

$$Io = \frac{Vi - Vc'}{R_{13}} \qquad (8)$$

Figure 8:
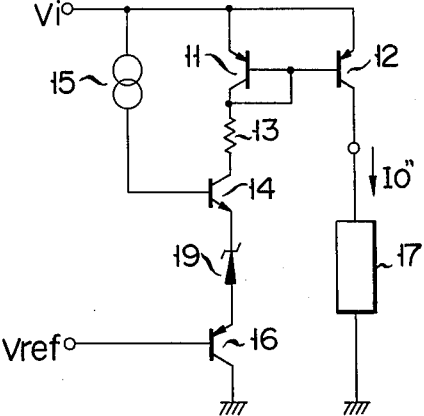
FIG. 8 shows a further embodiment of a limiter circuit according to the present invention.

FIG. 8 shows a further embodiment of a limiter circuit according to the present invention, wherein, instead of diodes $18_1$—$18_n$, as in FIG. 7, a Zener diode 19 is inserted in such a way that the cathode thereof is directed to the side of transistor 14. Assuming that the Zener voltage of Zener diode 19 is Vz and that cut-off voltage of this circuit is Vc", Vc" can be calculated from the following equation:

$$Vc = Vref + Vz + 2V_{BE} \qquad (9)$$

Zener voltage Vz of a Zener diode is usually so large as to be about 6 to 8 volts and, therefore, the cut-off voltage can be increased about 6 to 8 volts by inserting a Zener diode. Output current Io in this circuit can be expressed by the following equation:

$$Io = \frac{Vi - Vc''}{R_{13}} \qquad (10)$$

Figure 9:
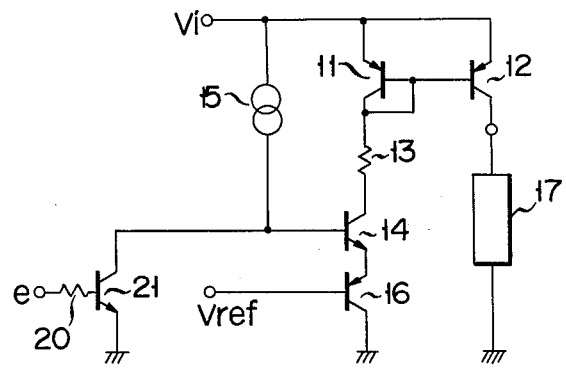
FIG. 9 shows a still further embodiment of a limiter circuit according to the present invention in which a control circuit is incorporated.

FIG. 9 shows a still further embodiment of a limiter circuit according to the present invention wherein a control circuit is added to the circuit shown in FIG. 5 so as to cause the latter to function as a limiter or to stop the latter from functioning as a limiter. The control circuit comprises a transistor 21 of NPN type whose collector is connected to the base of transistor 14, whose emitter is connected to the ground potential point, and whose base receives selectively positive voltage signals e through an input resistor 20. It is now assumed that the base of transistor 21 is kept open, namely, to receive no positive voltage signals, this transistor 21 is kept "OFF" and, therefore, current from constant-current source 15 flows into the base of transistor 14 to thereby turn transistor 14 "ON". Namely, the circuit shown in FIG. 9 is caused to function as a limiter in this case. On the contrary, it is assumed that positive input voltage e is supplied to the base of transistor 21, transistor 21 is turned "ON". Therefore, current from constant-current source 15 is caused to flow through the collector-emitter path of transistor 21 to thereby turn transistor 14 "OFF". Accordingly, the circuit shown in FIG. 9 is caused to stop functioning as a limiter in this case. As described above, it is possible that the circuit shown in FIG. 9 is caused to selectively function as a limiter by adding a controlling transistor 21 and selectively supplying positive input voltage e to the base of this transistor 21.

Figure 10:
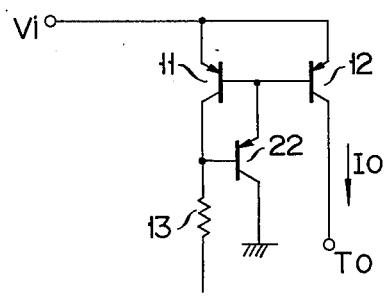
FIGS. 10 and 11 show other modes of a current mirror circuit which are incorporated in the limiter circuit, of the present invention.

FIG. 10 shows a modification of the current mirror circuit in the limiter circuit of the present invention. In this modification, the base of transistor 11 is not connected directly to the collector thereof as it is in the circuit shown in FIG. 5, but to the collector thereof through a transistor 22 of PNP type. Namely, the emitter of transistor 22 is connected to the bases of transistors 11 and 12, and the collector thereof is connected to the ground potential point. The base of transistor 22 is connected to the collector of transistor 11. In the case of this embodiment, relatively highly accurate output current can be obtained even if current-amplification factor $\beta$ of transistors 11 and 12 forming the current mirror circuit is small.

Figure 11:
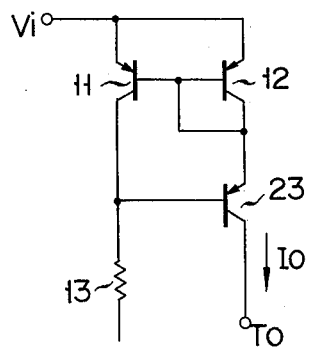

FIG. 11 shows another modification of the current mirror circuit. In this modification, the base and collector of transistor 12 are connected to each other. This modification includes further a transistor 23 of PNP type whose emitter is connected to the collector of transistor 12, whose collector to an output terminal To, and whose base to the collector of transistor 11. Also in the case of this embodiment, relatively highly accurate output current can be obtained like the circuit shown in FIG. 10 even if $\beta$ of transistors 11 and 12 forming the current mirror circuit is small.

Figure 14:
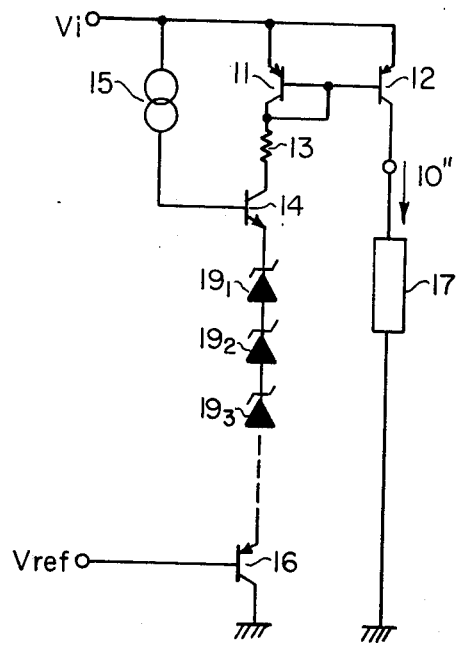
FIGS. 14 and 15 show still further embodiments of a limiter circuit according to the present invention.
Figure 15:
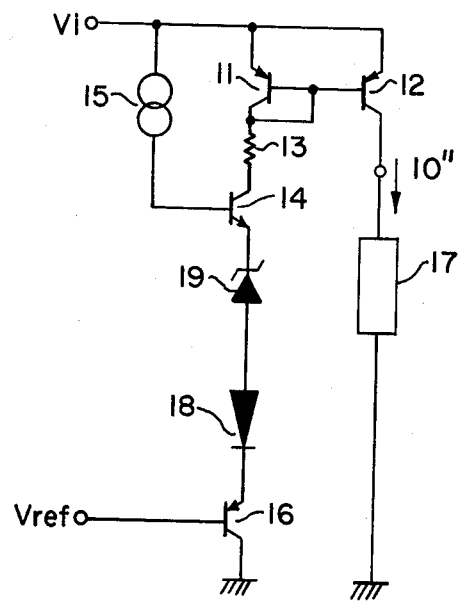

The present invention is not limited to the embodiments as described above, but it may be arranged so that more than one Zener diode are connected in series as shown in FIG. 14 or a Zener diode is connected in series to a usual diode as shown in FIG. 15, for example.

Figure 12:
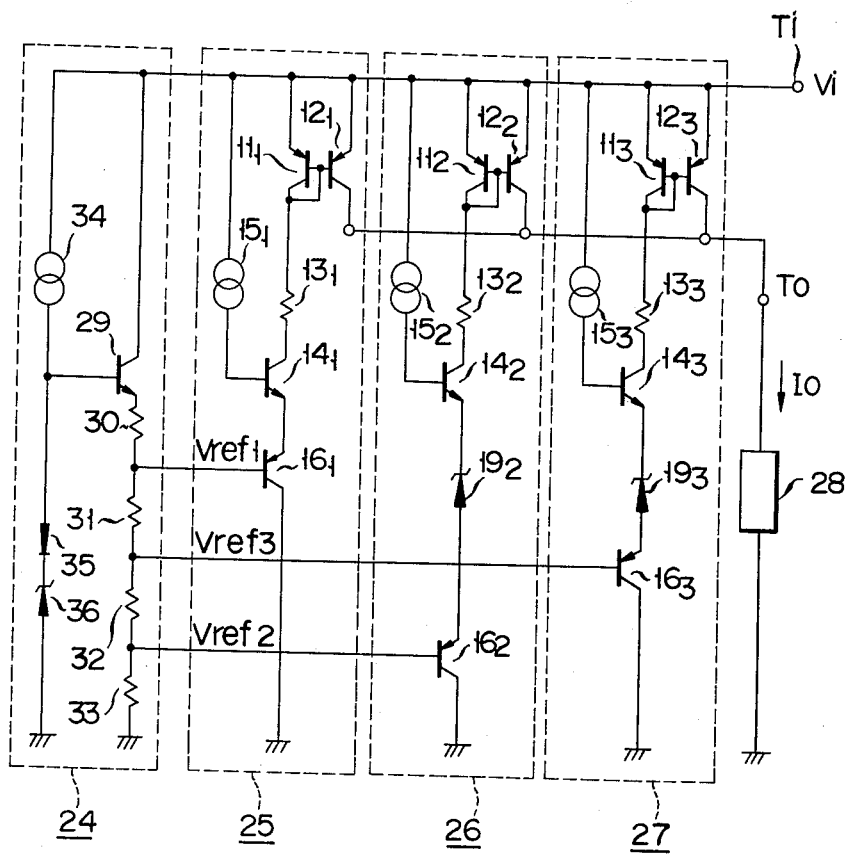
FIG. 12 is a circuit diagram showing a piecewise linear approach circuit which is modified according to the limiter circuit of the present invention.

FIG. 12 shows a piecewise linear approach circuit as example of application of a limiter circuit according to the present invention, said piecewise linear approach circuit comprising three limiter circuits whose cut-off voltages are different from one another. Reference numeral 24 in FIG. 12 represents a reference voltage generating circuit intended to obtain three reference voltages $Vref_1$, $Vref_2$ and $Vref_3$, respectively, from an input voltage supplied from outside. A first limiter circuit 25 corresponds to the one shown in FIG. 5 and second and third limiter circuits 26 and 27 correspond to the one shown in FIG. 8. The output terminal of each of limiter circuits 25, 26 and 27 is commonly connected to an output terminal To of the piecewise linear approach circuit. Between output terminal To and the ground potential point is connected a load circuit 28. Reference voltage generating circuit 24 comprises a transistor 29 of NPN type whose collector is connected to an input terminal Ti, four resistors 30, 31, 32 and 33 connected in series between this transistor 29 and the ground potential point, a constant-current source 34 connected between input terminal Ti and the base of transistor 29, and a diode 35 and a Zener diode 36 connected in reverse series between the base of transistor 29 and the ground potential point.

In the piecewise linear approach circuit thus formed, resistance values of resistors 30, 31, 32 and 33 of reference voltage generating circuit 24 are properly selected in such a way that three reference voltages $Vref_1$, $Vref_2$ and $Vref_3$ are 5.9(v), 2.3(v) and 5.3(v), respectively. It is also selected that base-emitter voltage $V_{BE}$ of each of transistors $14_1$, $14_2$, $14_3$, $16_1$, $16_2$ and $16_3$ of limiter circuits 25, 26 and 27 is 0.6(v), that values of resistors $13_1$, $13_2$ and $13_3$ are 68.9(k$\Omega$), 25.4(k$\Omega$) and 18.6(k$\Omega$), respectively, and that the Zener voltage of each of Zener diodes $19_2$ and $19_3$ of limiter circuits 26 and 27 is 6.7(v). Under the conditions thus selected, cut-off voltages $V_{c1}$, $V_{c2}$ and $V_{c3}$ of limiter circuits 25, 26 and 27 become 7.2(v), 10(v) and 13(v), respectively, and the following approximation formula can be established between input voltage Vi and current flowing into the load circuit 28:

$$Io \approx \{(\frac{Vi}{7})^2 - 1\} \times 0.4(mA) \qquad (11)$$

As is apparent from this formula, the circuit shown in FIG. 12 serves to function as a piecewise linear approach circuit in which output current Io changes like a parabolic curve against the change of input voltage Vi.

Figure 13:
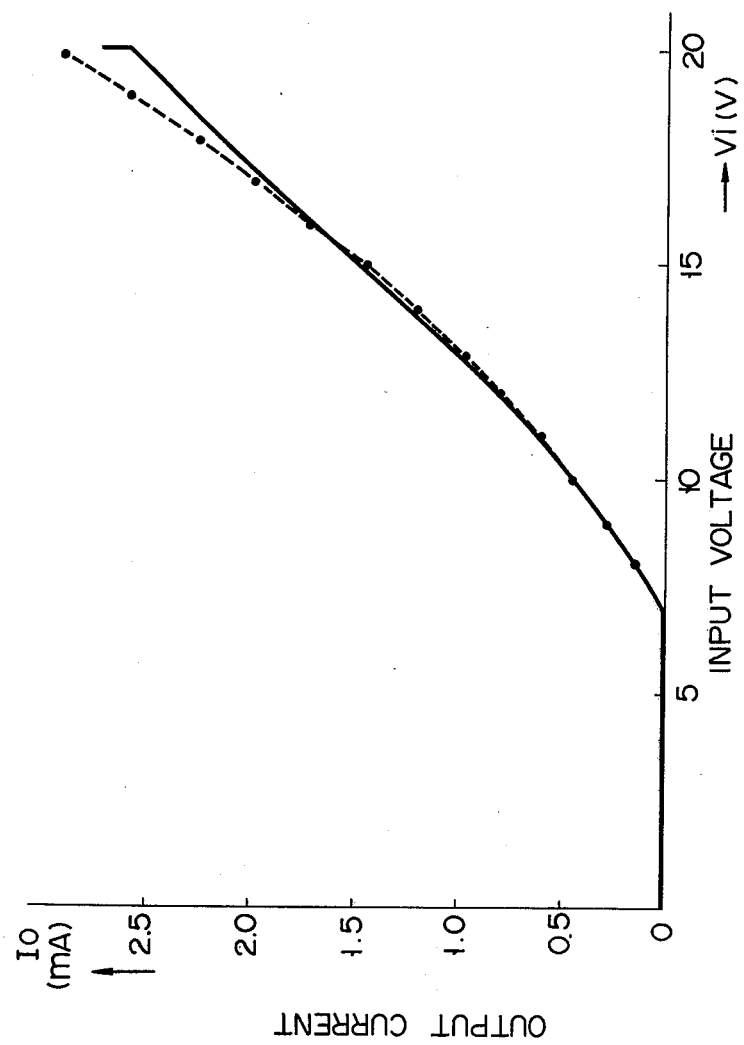
FIG. 13 shows a characteristic curve of the relation between input voltage and output current of the piecewise linear approach circuit shown in FIG. 12.

A solid line shown in FIG. 13 shows a characteristic curve of the relation between input voltage Vi and output current Io of the piecewise linear approach circuit shown in FIG. 12. The output current curve shown by the solid line consists of three straight line sections in which the slope of input voltage Vi changes at the values of 10(v) and 13(v) and approaches the continuously changing secondary curve shown by a dotted line.

As is apparent from the description made above with reference to various embodiments, the present invention provides a limiter circuit capable of blocking output current from flowing until input voltage becomes a predetermined value, making it unnecessary to use a reference voltage having a polarity reverse to that of the input voltage, and directly taking out output current without using a current buffer circuit. The present invention further provides a limiter circuit to which is added a control circuit by which the limiter circuit is controlled to serve or not to serve as a limiter circuit.

The current mirror circuit incorporated in the limiter circuit of FIG. 5 and current mirror circuits of FIGS. 10 and 11 are called a negative current mirror circuit. Other negative current mirror circuits are known. However, positive current mirror circuits may be incorporated into the limiter circuit according to this invention.

What is claimed is:

1. A limiter circuit comprising a current mirror circuit having an input terminal to which is supplied an input voltage, and having first and second output terminals; an impedance element to one end of which is connected the first output terminal of said current mirror circuit; a first transistor of first conductivity type having a collector-emitter path, one end of which is connected the other end of said impedance element; a second transistor of second conductivity type having a collector-emitter path which is connected between the other end of said collector-emitter path of said first transistor and a ground potential point and to the base of which are supplied reference potential signals; and bias means for providing the base of said first transistor with base bias.

2. A limiter circuit according to claim 1, further including at least one diode means connected between the collector-emitter paths of said first and second transistors.

3. A limiter circuit according to claim 1, further including at least more than two diode means connected in series between the collector-emitter paths of said first and second transistors.

4. A limiter circuit according to claim 1, further including a Zener diode connected between the collector-emitter paths of said first and second transistors.

5. A limiter circuit according to claim 1, further including at least more than two Zener diodes connected in series between the collector-emitter paths of said first and second transistors.

6. A limiter circuit according to claim 1, further including a series circuit of at least one diode and a Zener diode connected between the collector-emitter paths of said first and second transistors.

7. A limiter circuit according to claim 1 wherein said current mirror circuit comprises third and fourth transistors whose emitters are commonly connected to an input terminal and whose bases are commonly connected each other, the base of said third transistor being connected to the collector thereof and the collector of said fourth transistor being connected to an output terminal of the limiter circuit.

8. A limiter circuit according to claim 1 wherein said current mirror circuit comprises third and fourth transistors whose emitters are commonly connected to an input terminal and whose bases are commonly connected to each other, the collector of said third transistor being connected to an output terminal of the limiter circuit; and a fifth transistor whose emitter is connected to the bases of said third and fourth transistors, whose base is connected to the collector of said fourth transistor and whose collector is connected to the ground potential point.

9. A limiter circuit according to claim 1 wherein said current mirror circuit comprises third and fourth transistors whose emitters are commonly connected to an input terminal and whose bases are commonly connected each other, the base of said third transistor being connected to the collector thereof; and a fifth transistor whose emitter is connected to the collector and base of said third transistor, whose base is connected to the collector of said fourth transistor, and whose collector is connected to an output terminal of the limiter circuit.

10. A limiter circuit according to claim 1 further including a control means for selectively rendering the limiter circuit operative or inoperative, said control means comprising a third transistor whose collector is connected to the base of the first transistor and whose emitter is connected to the ground potential point, and a resistor to one end of which is supplied a control signal and the other end of which is connected to the base of the third transistor.

* * * * *

UNITED STATES PATENT AND TRADEMARK OFFICE
CERTIFICATE OF CORRECTION

PATENT NO. : 4,268,789
DATED : May 19, 1981
INVENTOR(S) : Nagano

It is certified that error appears in the above—identified patent and that said Letters Patent is hereby corrected as shown below:

Claim 1, col. 7 line 3, after "nected" and before

"the other end" insert --to--; and

Claim 7, col. 7 line 34, after "nected" and before

"each other" insert --to--; and

Claim 9, col. 8 line 19, after "nected" and before

"each other" insert --to--.

Signed and Sealed this

Twenty-seventh Day of October 1981

[SEAL]

Attest:

GERALD J. MOSSINGHOFF

Attesting Officer     Commissioner of Patents and Trademarks